US006943424B1

(12) United States Patent
Kim

(10) Patent No.: US 6,943,424 B1
(45) Date of Patent: Sep. 13, 2005

(54) ELECTRONIC PACKAGE HAVING A PATTERNED LAYER ON BACKSIDE OF ITS SUBSTRATE, AND THE FABRICATION THEREOF

(75) Inventor: Deok-Hoon Kim, Suweon (KR)

(73) Assignee: Optopac, Inc., Gyeonggi-do (KR)

( * ) Notice: Subject to any disclaimer, the term of this patent is extended or adjusted under 35 U.S.C. 154(b) by 0 days.

(21) Appl. No.: 10/885,654

(22) Filed: Jul. 8, 2004

Related U.S. Application Data

(60) Provisional application No. 60/568,228, filed on May 6, 2004.

(51) Int. Cl.[7] .................... H01L 31/0203; H01L 23/02
(52) U.S. Cl. .................... 257/433; 257/435; 257/680; 257/687; 257/778
(58) Field of Search .................... 257/431–436, 257/678, 680, 687, 778

(56) References Cited

U.S. PATENT DOCUMENTS

| 3,292,240 | A |   | 12/1966 | McNutt et al. |         |
|-----------|---|---|---------|---------------|---------|
| 5,302,778 | A |   | 4/1994  | Maurinus      |         |
| 5,583,076 | A |   | 12/1996 | Yoshizawa et al. |       |
| 5,716,759 | A |   | 2/1998  | Badehi        |         |
| 6,005,276 | A | * | 12/1999 | Forrest et al. | 257/432 |
| 6,040,235 | A |   | 3/2000  | Badehi        |         |
| 6,057,586 | A | * | 5/2000  | Bawolek et al. | 257/435 |
| 6,117,707 | A |   | 9/2000  | Badehi        |         |
| 6,441,478 | B2|   | 8/2002  | Park          |         |
| 6,447,688 | B2| * | 9/2002  | Kim           | 216/12  |
| 6,531,767 | B2| * | 3/2003  | Shrauger      | 257/678 |
| 6,566,745 | B1|   | 5/2003  | Beyne et al.  |         |
| 6,743,696 | B2|   | 6/2004  | Jeung et al.  |         |
| 6,759,642 | B2|   | 7/2004  | Hoshino       |         |
| 6,833,627 | B2| * | 12/2004 | Farnworth     | 257/778 |

FOREIGN PATENT DOCUMENTS

KR   1020020006343   1/2002

OTHER PUBLICATIONS

Zdenek Knittl, Optics of Thin Films (an Optical Multilayer Theory), John Wiley & Sons, Ltd., Prerov, Czechoslovakia, pp. 11-21; 364-365 (1976).
James D. Rancourt, Optical Thin Films, Users' Handbook, Macmillan Publishing Company, New York, New York, pp. v-xi, 210-213, (1987).
H.A. Macleod, Thin-Film Optical Filters, American Elsevier Publishing Company, Inc., New York, New York, pp. ix-x; 37-42; 56-57 (1969).
O.S. Heavens, Optical Properties of Thin Solid Films, Dover Publications, Inc., New York, New York, pp. v-vii; 46-63 (1965).

* cited by examiner

Primary Examiner—T. N. Quach
(74) Attorney, Agent, or Firm—Rosenberg, Klein & Lee

(57) ABSTRACT

A photo-sensing device package is provided. The package includes a substrate, at least one photo-sensing semiconductor die coupled to the substrate, and a patterned layer formed on a light receiving surface of the substrate. The substrate is formed of a material substantially transparent to light within a predetermined range of wavelengths, provided with front and backside surfaces on opposite sides thereof. The photo-sensing semiconductor die defines at least one photo-sensing area opposing the substrate front surface for receiving light impinging upon the substrate's backside surface and passing therethrough. The patterned layer is formed on the substrate's backside surface for blocking passage of at least a portion of the light otherwise impinging upon that backside surface, and is formed with a window opening aligned with at least a portion of the photo-sensing area for optical communication therewith through the substrate.

20 Claims, 3 Drawing Sheets

ELECTRONIC PACKAGE HAVING A PATTERNED LAYER ON BACKSIDE OF ITS SUBSTRATE, AND THE FABRICATION THEREOF

RELATED U.S. APPLICATION DATA

This Application is based on U.S. Provisional Patent Application Ser. No. 60/568,228, filed 6 May 2004.

BACKGROUND OF THE INVENTION

1. Field of the Invention

The present invention relates generally to electronic packaging of semiconductor integrated circuits. More specifically, the present invention relates to electronic packaging of photo-sensing semiconductor devices having a patterned layer formed on a surface of its substrate for optimizing performance.

2. Related Art

Novel electronic packaging techniques for applications incorporating photo-sensors are disclosed in co-pending U.S. patent application Ser. Nos. 10/692,816, 60/507,100, 10/829,273, and 60/536,536, the disclosures of which are incorporated herein by reference. FIGS. 1–2B illustratively show schematic cross-sectional views of certain exemplary electronic packages realized by such techniques, fuller descriptions of which are contained in such co-pending applications.

The package illustrated in FIG. 1 is typically suited for general applications, while that shown in FIGS. 2A, B is particularly well-suited for cellular telephone camera module applications, where compact size remains invariably among paramount concerns.

In packages of the type shown, a photo sensor device defines a certain photo-sensing area—defined at a center portion of a top surface in the configurations illustrated. A substrate having sufficient transmittance to light within a certain wavelength range of interest is provided with the photo sensor device. The substrate may be formed, for example, of a glass material where the photo-sensor device is to sense light, within the visual range in wavelength. Electrical interconnection lines and one or more passivation layers are formed over a front surface of the substrate (bottom surface of the substrate in the configuration illustrated); and, flipchip interconnections are typically employed between the photo-sensor device and substrate. A sealing structure is also provided for protecting the side wall portion of the photo-sensor device and the photo-sensing area that it extends about. Other structures such as solder balls and decoupling capacitances are also typically provided in the resulting package using suitable means known in the art, but their detailed description is not necessary for a clear understanding of the present invention, and for that reason not included.

In the electronic package configuration illustrated in FIGS. 1 and 2A, B, the photo-sensing area of the photo-sensing die opposes the front surface of the substrate, which in the figures forms the bottom face of the substrate. The substrate's front surface thus corresponding to the photo-sensing die's photo-sensing area is kept free of any interconnection metal traces or passivation layer in order not to block or otherwise disturb the light entering the photo-sensing area through that portion of the substrate.

Light, however, may enter the photo-sensing area through other undesirable paths. Such structures as a patterned metal layer are formed on the substrate's front surface, at portions thereof outside the photo-sensing area. Given the transmittance of the substrate and the reflectivity of the patterned metal layer or other structure, light passing into the substrate at these outer portions may nonetheless enter the photo-sensing area itself by reflective paths. Even at those outer portions with non-metal structures, such as a passivation layer, their light transmittance properties may very well permit light to transmit through them to reach the photo-sensing die or other nearby surface to cause detrimental effect.

Light entering through such unintended peripheral paths are potentially disruptive to proper operation in several notable ways. For instance, edges of a patterned metal layer tend to reflect the impinging light in an irregular manner. Correspondingly irregular, and very complicated light transmission and reflection thereby result. Consequently, unwanted disturbances may be introduced into the light being sensed at the photo-sensing area. A need exists, therefore, to provide suitable protective measures for photo-sensing packages of various type by which such disturbances may be minimized or altogether eliminated.

SUMMARY OF THE INVENTION

It is an object of the present invention to prevent unwanted light from being reflected into the photo-sensing area of the photo-sensor device in a given package.

This and other objects are attained by a photo-sensing device package formed in accordance with the present invention. The package comprises a substrate, at least one photo-sensing semiconductor die coupled thereto, and a patterned layer formed on a surface of the substrate. The substrate formed of a material substantially transparent to light within a predetermined range of wavelengths, with front and backside surfaces on opposite sides thereof. The photo-sensing semiconductor die defines at least one photo-sensing area opposing the front surface of the substrate for receiving light impinging upon the backside surface and passing through the substrate. The patterned layer is formed on the substrate's backside surface for blocking the passage of at least a portion of the light impinging upon that backside surface. The patterned layer is formed to define a window opening aligned with at least a portion of the photo-sensing area for optical communication therewith through the substrate.

In accordance with a preferred embodiment of the present invention, the window opening is rectangular in shape, and disposed in peripheral extent within the photo-sensing area.

Also in accordance with a preferred embodiment of the present invention, the photo-sensing semiconductor die is formed with a plurality of bonding pads. The substrate in that embodiment is formed of a material having sufficient transparency to light within a predetermined range of wavelengths, which the photo-sensing device is adapted to detect. The substrate has formed thereon at least one patterned metal layer for forming a plurality of interconnection metal lines, and at least one patterned passivation layer for protecting the interconnection metal lines. The passivation layer thus includes a plurality of openings to define on the substrate side bonding pads, which preferably include at least one set of pads for forming interconnections to the photo-sensing die, at least one set of pads for forming interconnections to an external system, and additional sets of pads for forming interconnections to other components, if required for the intended application.

Further in accordance with a preferred embodiment of the present invention, the electronic package includes flipchip interconnections between the photo-sensor device and substrate.

The electronic package structure in accordance with a preferred embodiment of the present invention may further include a sealing structure filling a gap between the photo-sensor and the substrate about the photo-sensing area of the photo-sensor.

DETAILED DESCRIPTION OF THE PREFERRED EMBODIMENTS

Figure 1:
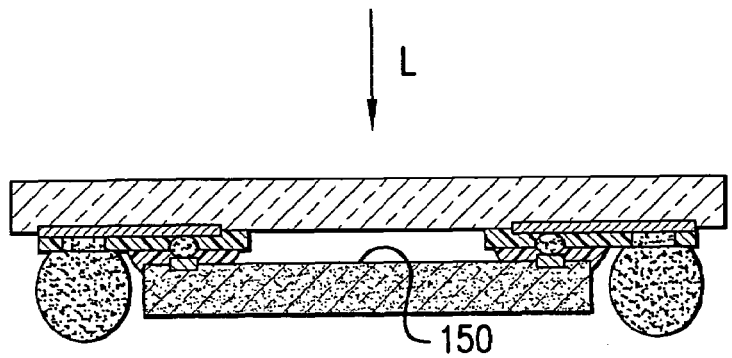
FIG. 1 is a schematic cross-sectional view of an illustrative photo-sensing electronic package formed in accordance with one exemplary embodiment of the invention disclosed in co-pending application Ser. No. 10/692,816.
Figure 2A:
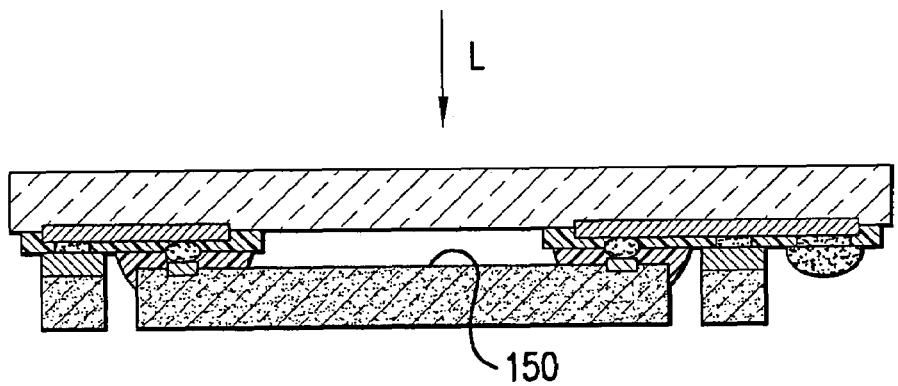
FIG. 2A is a schematic cross-sectional view of an illustrative photo-sensing electronic package formed in accordance with one exemplary embodiment of the invention disclosed in co-pending application Ser. No. 10/892,273.
Figure 2B:
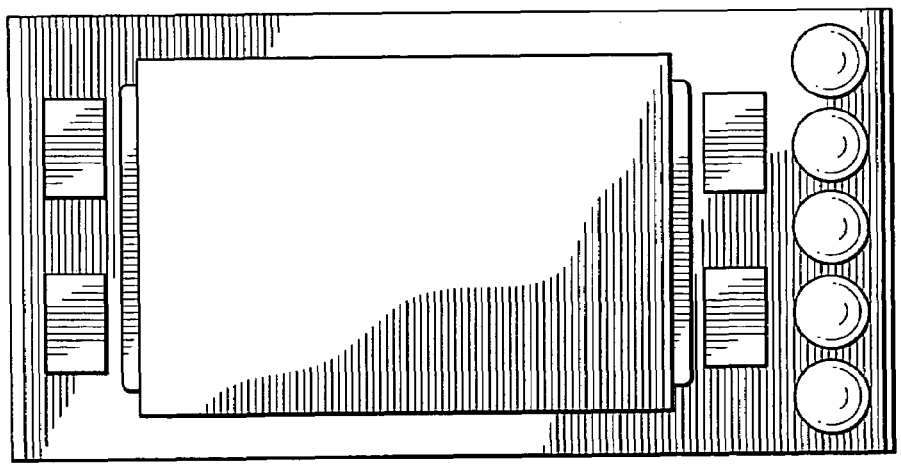
FIG. 2B is a bottom plan view of the photo-sensing electronic package embodiment illustrated in FIG. 2A.
Figure 3A:
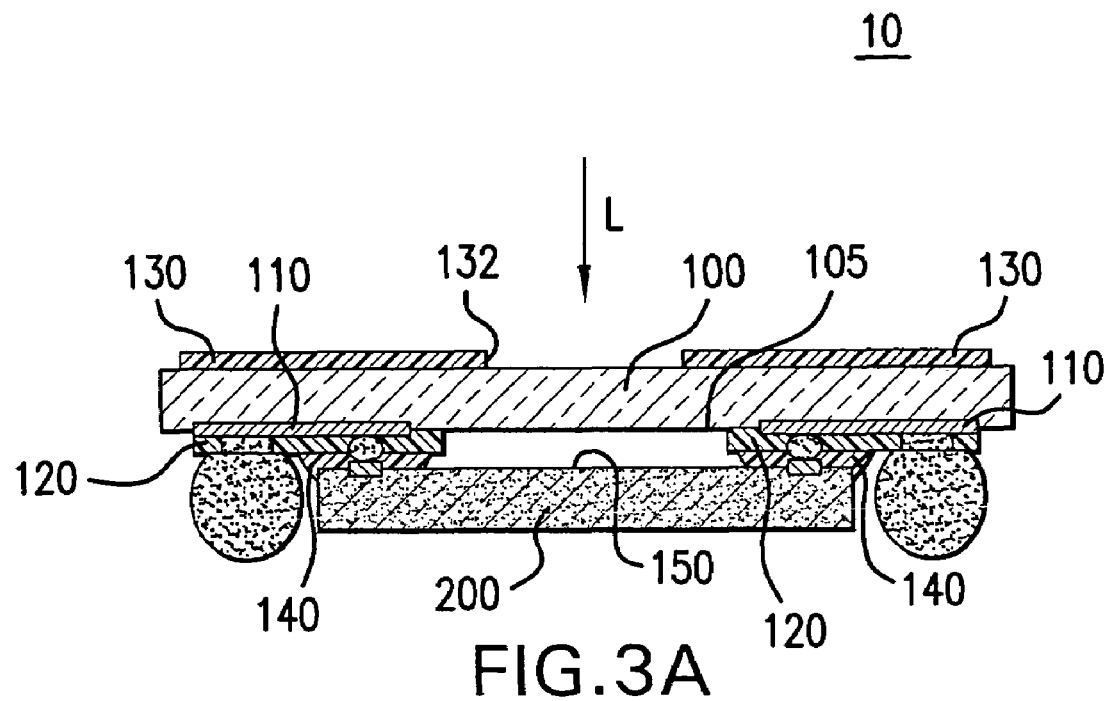
FIG. 3A is a schematic cross-sectional view of the photo-sensing electronic package embodiment illustrated in FIG. 1, formed with a patterned backside layer in accordance with one embodiment of the present invention.
Figure 3B:
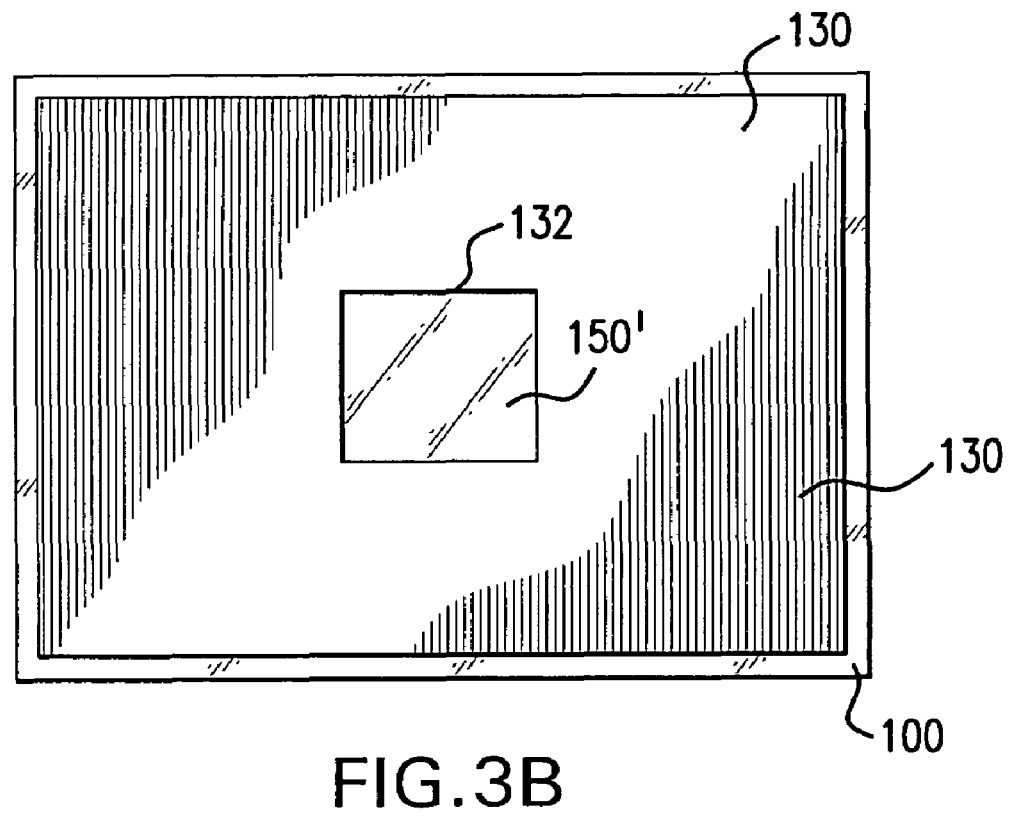
FIG. 3B is a schematic top plan view of the electronic package embodiment illustrated in FIG. 3A; and, FIG. 4 is a schematic cross-sectional view of the photo-sensing electronic package embodiment illustrated in FIGS. 2A, 2B, formed with a patterned backside layer in accordance with an embodiment of the present invention.
Figure 4:
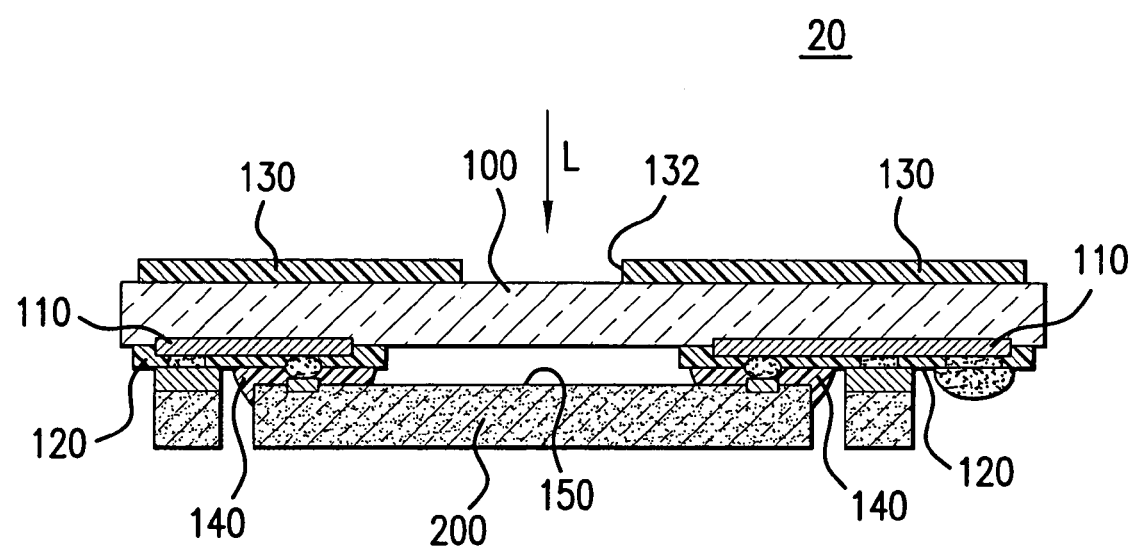

Referring now to FIGS. 3A–4, there are schematically shown illustrative packages 10, 20 each having a patterned layer 130 formed thereon in accordance with an exemplary embodiment of the present invention. In the interests of clarity and simplicity, like elements in the illustrated packages are indicated by like reference numbers.

In forming each package 10, 20 illustrated, a photo-sensing semiconductor wafer is typically provided with a plurality of dice, each die having integrated circuitry formed on a front surface of the wafer, with a plurality of bonding pads. The wafer has formed over its front surface a patterned passivation layer for protecting the integrated circuitry underneath. Openings are provided accordingly in the patterned passivation layer at the bonding pads. Each of the resulting photo-sensing dice defines at least one photo-sensing area at its front, or light receiving, surface.

Wafer bumping is a well-known technique that has been widely used since its initial teaching, as reflected in U.S. Pat. No. 3,292,240 entitled "Method of Fabricating Micromin-iature Functional Components," assigned to IBM. A typical wafer bumping process includes forming at least one patterned metal layer for making flipchip bump pads connected to bonding pads on the wafer. Metallurgy used for flipchip bump pads is commonly referred to as under bump metallurgy (UBM) and typically utilizes a multilayered structure to provide multiple functions, such as good adhesion to bonding pad, good diffusion barrier against bump material, and the like.

Many bump materials are known in the art. They include Gold, Nickel, Copper, and solder alloys, which are mainly Tin-based alloys.

Various techniques are known in the art for depositing UBM. They include sputtering, electroplating, electroless plating, or the like. Also various techniques are known in the art for forming a bump. An electroplating technique is often used in forming a Gold or Copper bump, while an electroless deposition technique is often used in forming a Nickel or Copper bump. In the case of a solder alloy bump, either an electroplating technique or a printing technique is typically used.

In accordance with the present invention, the photo-sensing semiconductor wafer may preferably, though not necessarily, include UBM pads formed over the bonding pads, depending on the particular flipchip bumping and mounting technology actually used. Alternatively, the photo-sensing semiconductor wafer of the present invention may, if necessary, further include flipchip bumps formed over the UBM pads.

A substrate is normally fabricated separately. This substrate is preferably disposed, initially, in wafer or panel form having a large area to form a plurality of unit substrates in a batch process, in much the same manner as the semiconductor wafer is formed with a plurality of dice fabricated thereon. Generally, the substrate material preferably includes sufficient degrees of: transparency, mechanical rigidity, and chemical stability—as required by the intended application.

In the photo-sensing applications illustrated, the substrate material is substantially transparent to a particular wavelength, or a particular range of wavelengths, so as to transmit light impinging upon a back side thereof to a photo-sensing device disposed at or near its front side. Suitable substrate materials preferably include, but are not limited to, glasses, quartz, sapphire, silicon, and others, the actual choice of particular substrate material depending on the wavelength range of interest in the intended application. Exemplary applications may employ photo-sensing devices operating at wavelengths in, for instance, the x-ray, ultra-violet, visible, or infrared spectra.

The substrate material must possess not only sufficient chemical resistance and mechanical stability to withstand the temperature and processing extremes to which it would be subjected during the necessary fabrication steps, but also sufficient resistance to expected environmental factors to support the resulting devices' expected service life. A preferable substrate material for photo-sensing devices operating in the visible range of wavelengths is any suitable glass material known in the art to be adapted for optical applications. Such glass materials tend to possess suitable degrees of chemical and temperature stability, and to be readily available at reasonable cost, and from many sources.

Depending on the requirements of the intended application, the substrate may be coated with at least one thin film layer on one or more of its surfaces to enhance the light transmission therethrough. Such coating may be of the so-called anti-reflection coating (ARC) type well known to persons versed in the optical art, which serves to minimize the reflection loss of light over the entire spectrum of interest. Similarly, the substrate may be coated with at least one thin film layer on one or more of its surfaces to enhance or reduce the transmission therethrough of light at a specific range of wavelengths. Such coatings are of the "optical filtering" type also known in the art of optics. One example is an infrared (IR) cut filter coating used in much the same manner an IR cut filter glass is used for a chip-on-board (COB) cellular phone camera module.

At least one patterned metal layer 110 is formed on the front surface 105 of the substrate 100 for making electrical interconnection lines. Then at least one patterned passivation layer 120 is formed on the patterned metal layer 110 for protecting the interconnection lines defined thereby. This patterned passivation layer 120 is formed with openings for making bonding pads at the substrate side. These bonding pads enable electrical interconnections to be made between the interconnection lines of the substrate 100 and the photosensor 200, external systems, and other components, if any.

In accordance with the present invention, the substrate may preferably, though not necessarily, further include UBM pads formed over the bonding pads if the bonding pads themselves are not sufficiently suitable for making flipchip bumps. Whether or not they are sufficiently suitable depends primarily upon the particular bonding pad material and flipchip technology used. Also in accordance with the present invention, the substrate may, though not necessarily, further include flipchip bumps formed over the UBM pads.

As shown in each of the embodiments of FIGS. 3A and 4, at least one photo-sensor die is mounted on a unit substrate 100, preferably by using a suitable flipchip assembly process known in the art. Flipchip assembly processes are of many suitable varieties, depending on the bump material used. In accordance with one of the most commonly used flipchip mounting processes, a flipchip joint is formed using a solder bump. With this process, a solder bumped die is placed onto a substrate having corresponding solder bump pads, then heated to the characteristic melting temperature of the solder material, with an application of flux.

Other known processes include thermo-sonic or thermo-compression bonding for joining gold bump to any suitable bonding pad. Thermo-compression bonding process may also be used with Isotropic Conductive Adhesive (ICA), Anisotropic Conductive Adhesive (ACA), or Anisotropic Conductive Film (ACF) in joining, for instance, gold, Nickel, or copper bump to any suitable bump or pad.

The electronic package 10, 20 in accordance with the present invention is not limited to any specific flipchip bump material or to any flipchip assembly process. The particular choice of such material and process will depend upon the specific requirements of the intended application.

The electronic package in accordance with a preferred embodiment of the present invention includes a sealing structure 140 filling the gap between the photo-sensing semiconductor die 200 and substrate 100 to define an enclosed cavity at the photo-sensing area 150 of the photo-sensing semiconductor die 200.

In accordance with the present invention, the package 10, 20 further includes a patterned layer 130 formed on a backside, or light impinging, surface of the substrate 100. This patterned layer 130 forms a window opening 132 aligned with at least a portion 150' of the photo-sensing area 150, whereby the patterned layer 130 effectively frames that portion 150', as best illustrated in FIG. 3B, to minimize optical interference due to the entry of stray light, for instance.

A most important requirement of this backside patterned layer 130 is its capacity to absorb light in the wavelength(s) of interest. For instance, in the visible range of light, a polymer or epoxy material having a black or other coloring agent sufficiently opaque to light in the wavelength(s) of interest may be employed as the patterned layer 130.

This patterned backside layer 130 may be formed using any of numerous suitable methods known in the art. Stencil or screen printing with a liquid encapsulant or a polymer material is one of the simplest methods by which to apply and appropriately pattern the layer 130. Other suitable methods include needle dispensing a liquid encapsulant onto the substrate surface. A suitable viscosity of the liquid encapsulant material so applied preferably ranges between approximately 3,000–80,000 centi poise. The thickness of the layer 130 then depends in part on as the viscosity of the material and the application method employed, but preferably ranges between approximately 4–100 micrometers. Whichever application material and method are employed, it is important that suitable measures be taken to guard against contaminating that portion of the substrate disposed over the photo-sensing area 150 (inner region within the opening 132) during the patterned layer's formation.

Yet another method for forming the patterned backside layer 130 is spin coating and patterning. Numerous spinnable polymer materials are commercially available. They are available in either a photo-definable or a non-photo-definable type; however, use of the photo-definable type is more prevalent in the art. Such materials are most often applied using dielectric interlayer or buffer coating techniques. Typical material viscosities range from approximately 1000–4000 centi poise.

As they tend to be at least partially transparent to light in the visible range of wavelengths, adding black or other coloring agents of sufficient opacity to the polymer material may be necessary to attain sufficient non-transparency to the visible range of light. With the spin coating and patterning approach, an approximate 4–20 micrometer range of thicknesses may typically be realized depending on the material's viscosity. An advantage of this spin coating and patterning method over screen or stencil printing, or over needle dispensing is the greater film uniformity and less likelihood of substrate contamination over the photo-sensing area 150.

In accordance with a preferred embodiment of the present invention, the patterned backside layer 130 is formed on the substrate 100 of a photo-definable polymer material using a spin coating and developing technique for patterning, to a thickness ranging within approximately 4–20 micrometers. Preferably, the material for the patterned layer 130 exhibits sufficient absorption of light in the wavelength(s) of interest.

The unique package formed in accordance with the present invention is applicable to all types of photo sensors or photo detectors fabricated with various types of technologies known in the art, such as CCD or CMOS. The present invention is applicable wherever area image sensors are used, such as in camcorders, digital still cameras, PC cameras, mobile phone cameras, PDA and handheld cameras, security cameras, toys, automotive equipment, biometrics, and the like. The present invention is also applicable to linear array image sensors such as those used in fax machines, scanners, bar code readers and scanners, digital copiers, and the like. It is equally applicable in packaging non-imaging photo-sensors such as single diode or four-quadrant diodes used in motion detectors, light level sensors, positional or tracking systems, and the like. Additionally, the present invention is applicable to other general electronic packages that require sealing only at particular predetermined areas.

Although this invention has been described in connection with specific forms and embodiments thereof, it will be appreciated that various modification other than those discussed above may be resorted to without departing form the spirit or scope of the invention. For example, equivalent elements may be substituted for those specifically shown or described, certain features may be used independently of other features, and in certain cases, particular combinations of fabrication or assembly steps may be reversed or interposed, all without departing from the spirit or scope of the invention as defined in the appended claims.

What is claimed is:

1. A photo-sensing device package comprising:
   a. a substrate formed of a material substantially transparent to light within a predetermined range of wavelengths, said substrate having front and backside surfaces on opposite sides thereof,
   b. at least one photo-sensing semiconductor die coupled to said substrate, said photo-sensing semiconductor die defining at least one photo-sensing area opposing said front surface of said substrate for receiving light impinging upon said backside surface and passing through said substrate; and,
   c. a patterned layer formed on said backside surface of said substrate for blocking the passage of at least a portion of the light impinging upon said backside surface, said patterned layer defining a window opening aligned with at least a portion of said photo-sensing area for optical communication therewith through said substrate.

2. The photo-sensing device package as recited in claim 1 wherein said window opening is rectangular in shape, said window opening being disposed in peripheral extent within said photo-sensing area.

3. The photo-sensing device package as recited in claim 1 wherein said patterned layer is formed of a material absorptive to light within said predetermined range of wavelengths.

4. The photo-sensing device package as recited in claim 3 wherein said patterned layer is formed of a material selected from the group consisting of: a liquid encapsulant material, an epoxy material, and a polymer material.

5. The photo-sensing device package as recited in claim 4 wherein said patterned layer is formed of a material containing a coloring agent substantially opaque to light within said predetermined range of wavelengths.

6. The photo-sensing device package as recited in claim 4 wherein said patterned layer is formed of a material having a thickness substantially within an approximating range of 4–100 micrometers.

7. The photo-sensing device package as recited in claim 4 wherein said patterned layer formed upon said backside surface of said substrate is of a type selected from the group consisting of: a stencil printed layer; a screen printed layer; a needle dispensed layer; a spin coated and patterned layer; and, a spin coated and photo-developed layer.

8. The photo-sensing device package as recited in claim 7 wherein said predetermined range of wavelengths includes the visible range of wavelengths.

9. The photo-sensing device package as recited in claim 3 wherein said photo-sensing semiconductor die is spaced from said front surface of said substrate by a gap.

10. The photo-sensing device package as recited in claim 9 further comprising a sealing structure disposed between said photo-sensing semiconductor die and said substrate to extend about and enclose said gap to define a sealed cavity between said photo-sensing area and a portion of said substrate front surface.

11. A photo-sensing device package comprising:
    a. a substrate formed of a material substantially transparent to light within a predetermined range of wavelengths, said substrate having front and backside surfaces on opposite sides thereof, said front surface having an inner region and an outer region extending thereabout, interconnection line and passivation layers of said substrate being formed on said outer region;
    b. at least one photo-sensing semiconductor die coupled to said outer region of said substrate front surface, said photo-sensing semiconductor die defining at least one photo-sensing area opposing said inner region of said substrate front surface for receiving light impinging upon said backside surface and passing therethrough; and,
    c. a patterned layer formed on said backside surface of said substrate for absorbing at least a portion of the light impinging upon said backside surface, said patterned layer being formed about a window opening aligned with at least a portion of said photo-sensing area for optical communication therewith through said substrate, whereby at least a portion of said photo-sensing area is substantially enframed to minimize optical interference.

12. The photo-sensing device package as recited in claim 11 wherein said window opening is rectangular in shape, said window opening being disposed in peripheral extent within said photo-sensing area.

13. The photo-sensing device package as recited in claim 12 wherein said patterned layer is formed of a material selected from the group consisting of: a liquid encapsulant material, an epoxy material, and a polymer material.

14. The photo-sensing device package as recited in claim 13 wherein said patterned layer is formed of a material having a thickness substantially within an approximating range of 4–100 micrometers.

15. The photo-sensing device package as recited in claim 14 wherein said patterned layer formed upon said backside surface of said substrate is of a type selected from the group consisting of: a stencil printed layer; a screen printed layer; a needle dispensed layer; a spin coated and patterned layer; and, a spin coated and photo-developed layer.

16. The photo-sensing device package as recited in claim 15 wherein said patterned layer is formed of a material containing a substantially opaque coloring agent.

17. The photo-sensing device package as recited in claim 16 wherein said substrate is formed of a glass material substantially transparent to light in the visible range of wavelengths.

18. An integrated photo-sensing apparatus comprising:
    a. a substrate formed of a material substantially transparent to light within a visible range of wavelengths, said substrate having front and backside surfaces on opposite sides thereof, said front surface having an inner region and an outer region extending thereabout, interconnection line and passivation layers of said substrate being formed on said outer region;
    b. at least one photo-sensing semiconductor die coupled by flipchip interconnection to said outer region of said substrate front surface, said photo-sensing semiconductor die defining at least one photo-sensing area opposing said inner region of said substrate front surface for receiving light impinging upon said backside surface and passing therethrough, said photo-sensing region being spaced from said inner region by a gap;
    c. a sealing structure disposed between said photo-sensing semiconductor die and said substrate to extend about and enclose said gap to define a sealed cavity between said photo-sensing area and at least a portion of said inner region of said substrate front surface; and,
    d. a patterned layer formed on said backside surface of said substrate for absorbing at least a portion of the light impinging upon said backside surface, said patterned layer defining a window opening to optically enframe at least a portion of said inner region of said front surface, said window opening being aligned with at least a portion of said photo-sensing area for optical communication therewith through said substrate.

19. The photo-sensing device package as recited in claim 18 wherein said patterned layer formed upon said backside surface of said substrate is of a spin coated and photo-developed type, said patterned layer being formed of a spinnable and photo-definable polymer material including a substantially opaque coloring agent.

20. The photo-sensing device package as recited in claim 19 wherein said patterned layer is formed of a material having a thickness substantially within an approximating range of 4–20 micrometers.

* * * * *